United States Patent
Yin et al.

(10) Patent No.: US 8,121,239 B2
(45) Date of Patent: Feb. 21, 2012

(54) UNIDIRECTIONAL SWEEP TRAINING FOR AN INTERCONNECT

(75) Inventors: Liang Yin, San Jose, CA (US); Harry Muljono, Union City, CA (US); Sunil Kumar, Santa Clara, CA (US); Alex Kuperman, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 1046 days.

(21) Appl. No.: 12/069,460

(22) Filed: Feb. 11, 2008

(65) Prior Publication Data

US 2009/0202027 A1 Aug. 13, 2009

(51) Int. Cl.
*H04L 7/00* (2006.01)
(52) U.S. Cl. ........................................................ 375/355
(58) Field of Classification Search .................. 375/354, 375/355, 357, 359, 362, 371, 373, 376
See application file for complete search history.

(56) References Cited

U.S. PATENT DOCUMENTS

| | | | |
|---|---|---|---|
| 6,009,488 A | 12/1999 | Kavipurapu | 710/105 |
| 6,466,098 B2 * | 10/2002 | Pickering | 331/25 |
| 6,650,159 B2 | 11/2003 | Wang et al. | 327/258 |
| 7,123,051 B1 * | 10/2006 | Lee et al. | 326/40 |
| 2001/0046163 A1 * | 11/2001 | Yanagawa | 365/194 |
| 2004/0114698 A1 * | 6/2004 | Barrett et al. | 375/355 |
| 2007/0041319 A1 | 2/2007 | Chilukoor et al. | 370/235 |
| 2008/0175310 A1 * | 7/2008 | Okamura et al. | 375/232 |
| 2009/0028073 A1 * | 1/2009 | Barrett et al. | 370/276 |
| 2009/0154626 A1 * | 6/2009 | Anderson et al. | 375/360 |
| 2009/0252265 A1 * | 10/2009 | Xia et al. | 375/355 |

* cited by examiner

*Primary Examiner* — Jaison Joseph
(74) *Attorney, Agent, or Firm* — Trop, Pruner & Hu, P.C.

(57) ABSTRACT

In one embodiment, the present invention includes a receiver having a delay lock loop (DLL) to receive a clock signal and to generate a plurality of clock phases therefrom, and an offset controller including a first register set for a first phase interpolator and a second register set for a second phase interpolator. At initiation of a track pre-tune process, both phase interpolators are controlled to generate sampling signals at a common clock phase. Other embodiments are described and claimed.

16 Claims, 5 Drawing Sheets

UNIDIRECTIONAL SWEEP TRAINING FOR AN INTERCONNECT

BACKGROUND

In a forwarded clock system such as for an interconnect in a computer system, incoming data at a receiver is sampled by a transmitted clock. Upon entering the receiving agent, the clock is provided to a delay lock loop (DLL), which can generate multiple clock phases. To ensure that the data is sampled in the middle of the data eye, with maximum setup and hold time to allow for as much timing margin as possible, a phase interpolator (PI) produces a refined clock edge which is then used to sample the data. The PI settings are programmed by means of an interpolator filter and control block. This block processes the sampled data at all PI positions and adjusts the PI setting to produce a sampling clock that is phase aligned with the incoming data. This is done during initial training and periodic re-training periods. The periodic re-training accounts for drift of the skew between the input data and the forwarded clock input. However, such training can be cumbersome and require substantial amounts of time, as uncertainty in PI initialization can occur, as with a small effective eye width, the sampling eye generated by the PI can be outside the data eye.

DETAILED DESCRIPTION

In various embodiments, one or more phase interpolators (PIs) can realize accurate placement of sampling edges in the center of even and odd data eyes independently of a data duty cycle. In one embodiment each receiver lane of a physical layer of a receiver has two PIs, one for 90-degree data (data90) samples and one for 270-degree data (data270) samples. There are total of six registers associated with these three PIs: three for data90 and three for data270.

The three registers for each PI include a left eye register, a right eye register and a center register. The left eye register indicates the leftmost safe position to sample data, and the right eye register indicates the rightmost safe position to sample data. The center register holds the average value of the left and right eye registers. In one embodiment, the value in the center register is used by the corresponding PI to generate a clock edge used by a data sampler to sample the data. The purpose of the left and right eye registers is to help derive the center register value.

In one embodiment, there are three major stages in a PI adjustment algorithm: track-pre-tune, left-eye-tune, and right-eye tune. Track-pre-tune is the first stage of tuning. The purpose of this stage is to roughly place the even and odd sampling edges within the even and odd eyes, respectively, to provide a good starting point for the next two stages, which provide much finer tuning capability. In this stage, the six PI register values representing the data90 and data270 edges start at a fixed, known position with respect to a delay lock loop (DLL) clock. As will be described further below, such a DLL may generate eight clock signals, each 45 degrees apart. In various embodiments each of the registers may be initialized at a common point, namely a zero degree clock generated by the DLL, which corresponds to a zero offset value. From these clock signals and offset values provided by the PI registers, the PIs can generate sampling signals accordingly. From this initial or baseline position at the zero degree clock, a pre-tuning method in accordance with an embodiment of the present invention may sweep through the full range of PI settings in a unidirectional manner and compute all the register values in the process. Each PI will independently find its optimum position for an incoming data pattern, which may be a predetermined data pattern of alternating logic ones and zeroes.

Figure 1:
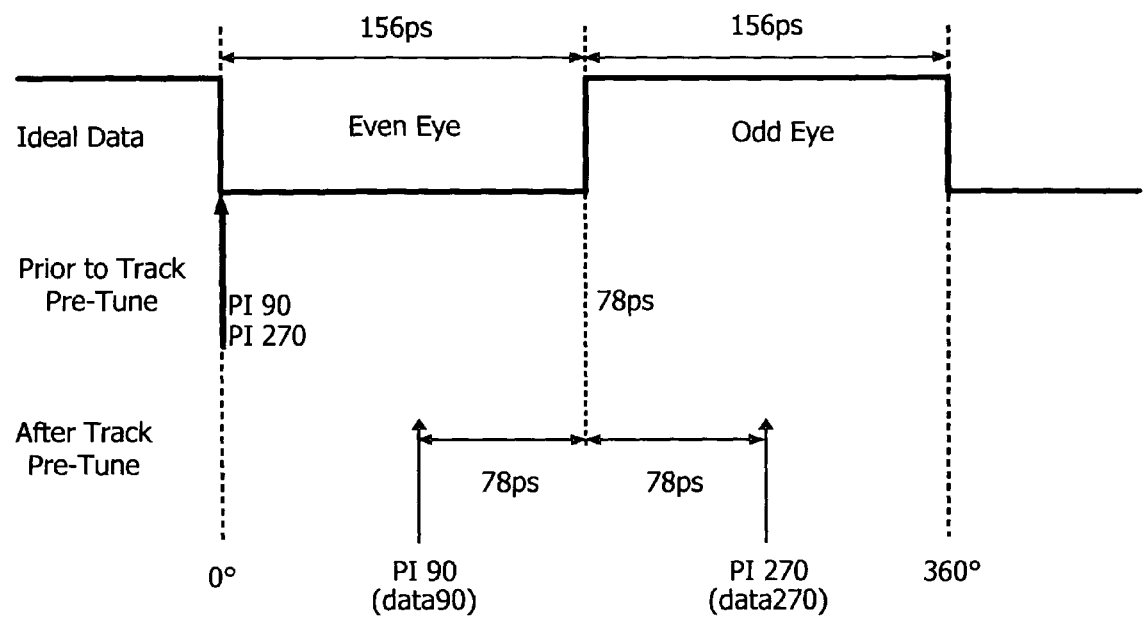
FIG. 1 is a timing diagram of incoming data and track pre-tuning operations in accordance with an embodiment of the present invention.

Referring now to FIG. 1, shown is a timing diagram of incoming data and track pre-tuning operations in accordance with an embodiment of the present invention. As shown in FIG. 1, a receiver may receive incoming data. More specifically, such data may be ideal data of alternating logic zeroes and ones. Thus as shown at a time zero corresponding to a zero degree clock, a data transition from a logic one to a logic zero occurs such that a logic zero even eye is transmitted, followed by a transition to a logic one odd eye. As shown in the implementation of FIG. 1, each eye may have a time of 156 picoseconds (ps), although the scope of the present invention is not limited in this regard. That is, in actual system implementation, the size of the eyes may be smaller, and substantially smaller due to various issues such as data jitter, common mode noise, channel issues and so forth.

Still referring to FIG. 1, prior to track pre-tuning in accordance with an embodiment of the present invention, because all PI registers may be set to a fixed, known position, namely at a zero degree phase of the DLL, all registers may have a value of zero. Note that while for ease of illustration this zero degree phase is shown at a data transition at the beginning of the even eye, because there is no fixed relationship between incoming data and the DLL clock, this situation is highly unlikely to occur, as the DLL clock and the incoming data have no phase relation.

Thus as shown in FIG. 1, because the values in the PI registers are zero, both PI 90 and PI 270 generate a sampling edge at this zero degree phase. However, as just mentioned, this location is for ease of illustration and because of the lack of relationship between incoming data and DLL clock, these two sampling edges could be located anywhere within the even eye or odd eye. Accordingly, track pre-tuning in accordance with an embodiment of the present invention may proceed to enable generation of sampling edges substantially at a mid-portion of the eye openings. Thus as shown at the bottom portion of FIG. 1, after track pre-tuning, PI 90 should be placed substantially in the center of the even eye, while the sampling edge generated by PI 270 may be placed substantially in the middle of the odd eye.

Figure 2:
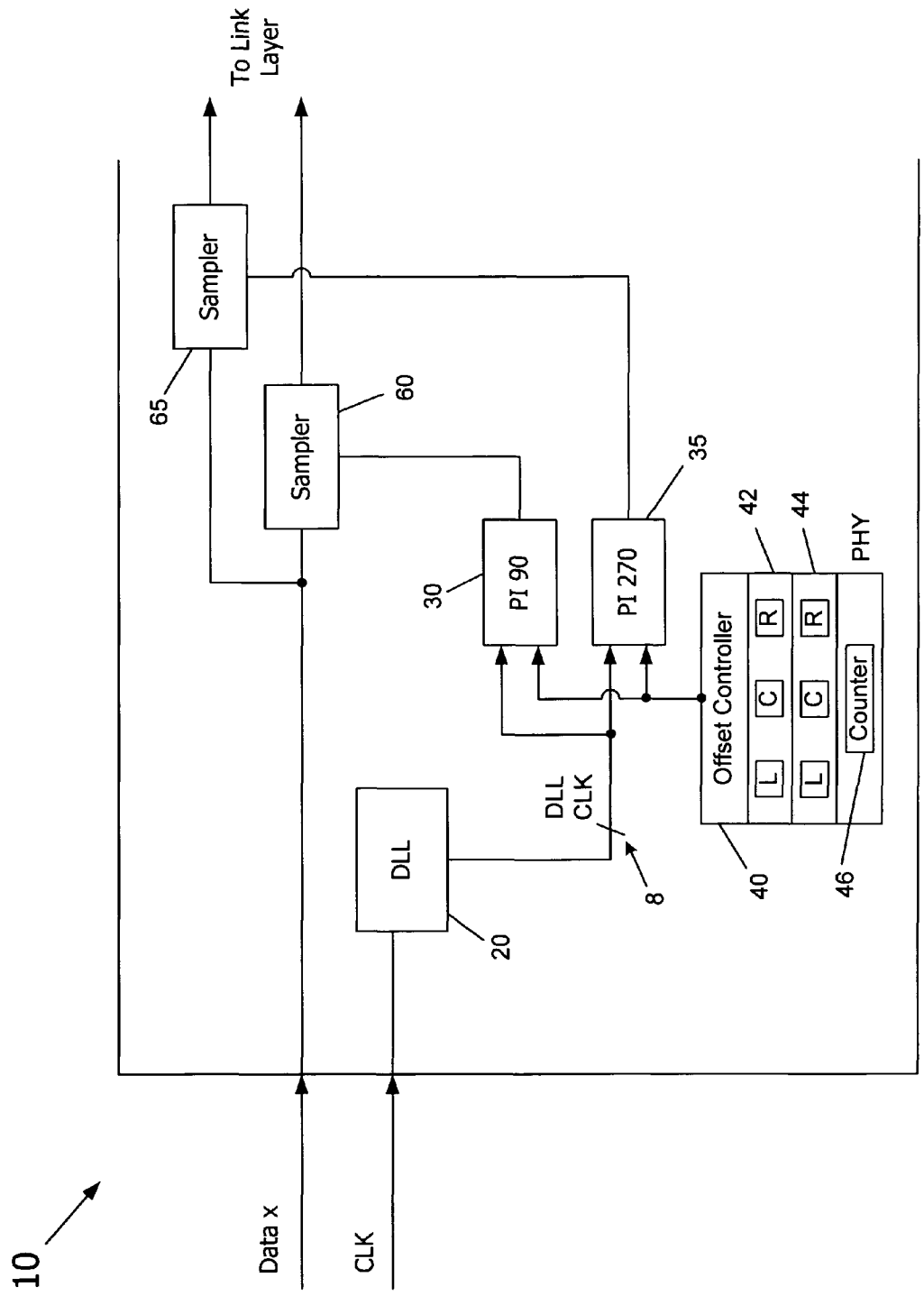
FIG. 2 is a block diagram of a portion of a receiver in accordance with an embodiment of the present invention.

Referring now to FIG. 2, shown is a block diagram of a portion of a receiver in accordance with an embodiment of the present invention. As shown in FIG. 2, receiver 10 may be coupled to receive incoming data from an interconnect such as a point-to-point (PtP) interconnect. As specifically shown in FIG. 2, receiver 10 is coupled to receive an incoming clock signal, CLK, which may be a forwarded clock signal from a transmitter, e.g., of a semiconductor component coupled to receiver 10, which may be another semiconductor component such as a processor, chipset or other such agent. Still further, receiver 10 receives incoming data, shown in FIG. 2 as a single data lane, $Data_x$. However, understand that in various implementations such as a given PtP interconnect protocol, twenty such data lanes may be present, although other numbers of lanes are certainly possible.

Still referring to FIG. 2, the clock forwarded signal is provided to DLL 20, which may generate multiple DLL clocks therefrom. More specifically, DLL 20 may generate 8 DLL clock phases, each separated by 45 degrees. As will be described further below, the DLL-generated clocks may be used to generate the sampling signals in a pair of phase interpolators (PIs) 30 and 35. Note that only two phase interpolators are present for the corresponding data lane. Of course, each lane may have its own separate phase interpolators. Such minimal amount of phase interpolators may reduce size and power consumption of the physical layer of receiver 10. PIs 30 and 35 may operate at a phase difference of 180 degrees. For example, first PI 30 may be controlled to operate at 90 degrees, while second PI 35 may be controlled to operate at 270 degrees such that the two interpolators generate sampling cycles in the even and odd eyes, respectively, although the scope of the present invention is not limited in this regard. As mentioned above, PIs 30 and 35 may generate sampling signals (also referred to as sampling edges) that are used to clock a pair of samplers 60 and 65, each of which receive the incoming data of data lane Data$_x$. The sampled data may then be provided for further processing within receiver 10, e.g., in a link layer or other such protocol layer.

To control the accurate positioning of these sampling signals from PIs 30 and 35 to be within a valid data eye, given that the data eye may be much smaller than a unit interval, embodiments may further include an offset controller 40 which provides offset information independently to first PI 30 and second PI 35. More specifically, offset controller 40 may include a first register set 42 and a second register set 44. Each register set may include a left register, a right register and a center register, each associated with one of PIs 30 and 35, as discussed above. The values placed into these registers may be provided from a counter 46, which may generate clock ticks with respect to the zero degree DLL clock phase. For example, in one implementation counter 46 may be configured as a 6-bit counter such that the period of the DLL clock is segmented into 64 different steps. During operation, the values (i.e., offset values) stored in the center registers of register sets 42 and 44 may be provided to the corresponding PIs 30 and 35. In turn, each PI may receive the incoming DLL clock phases and this offset value and perform a mixing operation to mix two or more of the DLL clock phases based on the offset value.

Using embodiments of the present invention, track pre-tuning may be performed to generate pre-tune values for storage in the left, center and right registers of each of register sets 42 and 44. In one embodiment, track pre-tuning may be split into multiple sub-stages, as follows: first, a reset stage in which all left, center and right registers of PIs 30 and 35 are set to zero. This causes both PIs to produce sampling edges that correspond with the 0 degree phase of the DLL. Next, a baseline stage in which both PIs shift together one step at a time to find a solid '1' occurs. The purpose here is to make sure that the flow is consistent and that the left edge of the even eye '0' is seen first. Next, a "Find Solid 0" stage, in which both PIs shift together to find a solid '0' occurs. When this is found, all left, center and right registers of both register sets record the first occurrence of the solid '0'. Next, a "Find Next Fuzzy Zone" stage occurs, in which PIs shift together. The left register of PI90 retains the location of the solid '0', while the right register of PI90 records the first occurrence of the fuzzy '1', and the center PI90 register computes the average value of the two by shifting at half the rate of the right register. Then a "Find Solid 1" stage occurs, in which only PI270 moves and PI90 remains where it was at the end of the previous sub-stage. The left register of PI270 records the first occurrence of a solid '1'. Next, a "Find Next Fuzzy Zone" stage occurs, in which PI270 continues moving until the first occurrence of a fuzzy '0'. The right register of PI270 records this position. The left and center registers of PI270 maintain the locations of the left edge and center of the odd eye as they did for the even eye as above. At this point, pre-tuning is done and the PIs will respectively shift to the average of their left and right registers' values that is held in their center registers.

Figure 3A:
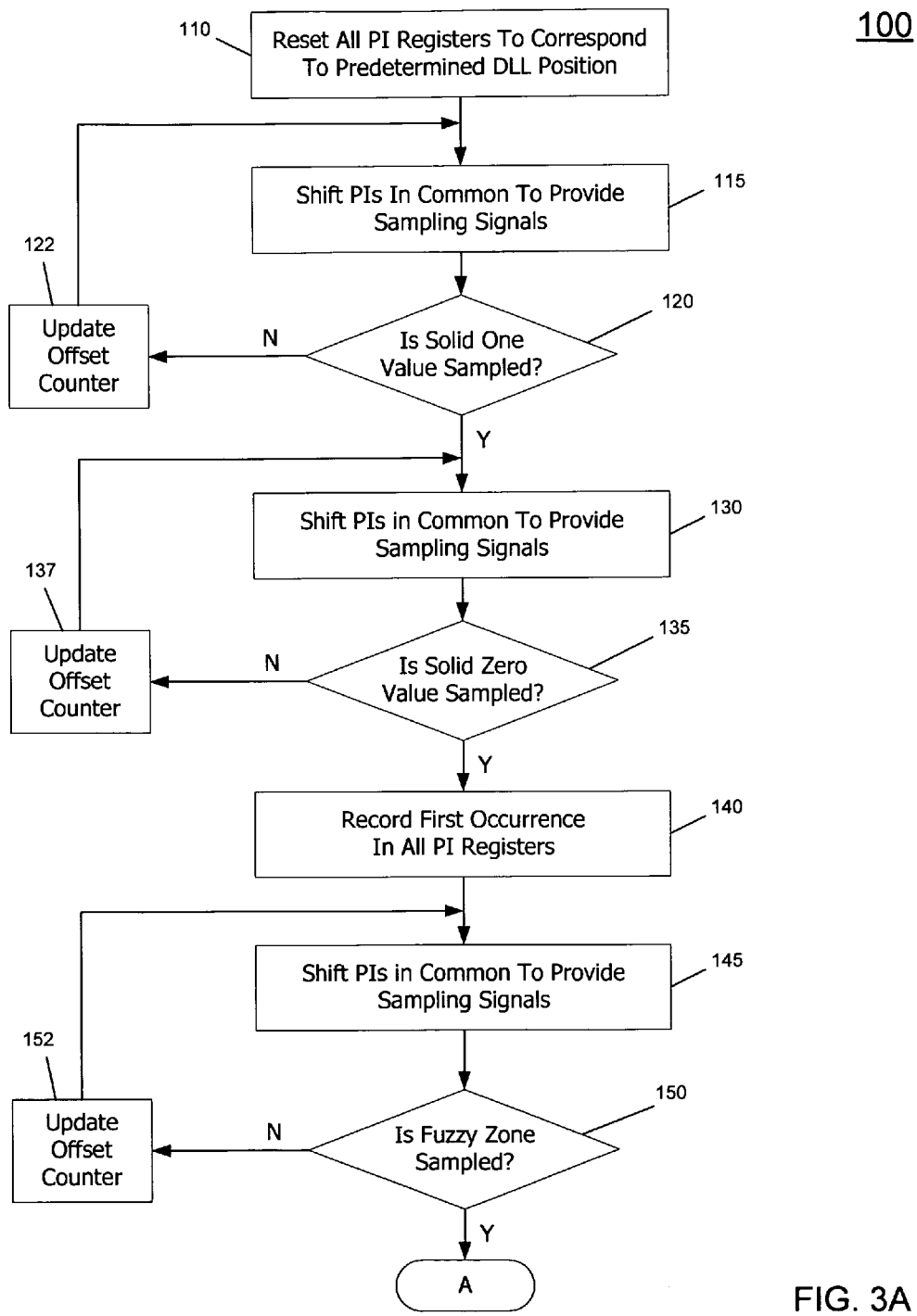
FIGS. 3A and 3B are a flow diagram for performing track pre-tuning in accordance with an embodiment of the present invention.
Figure 3B:
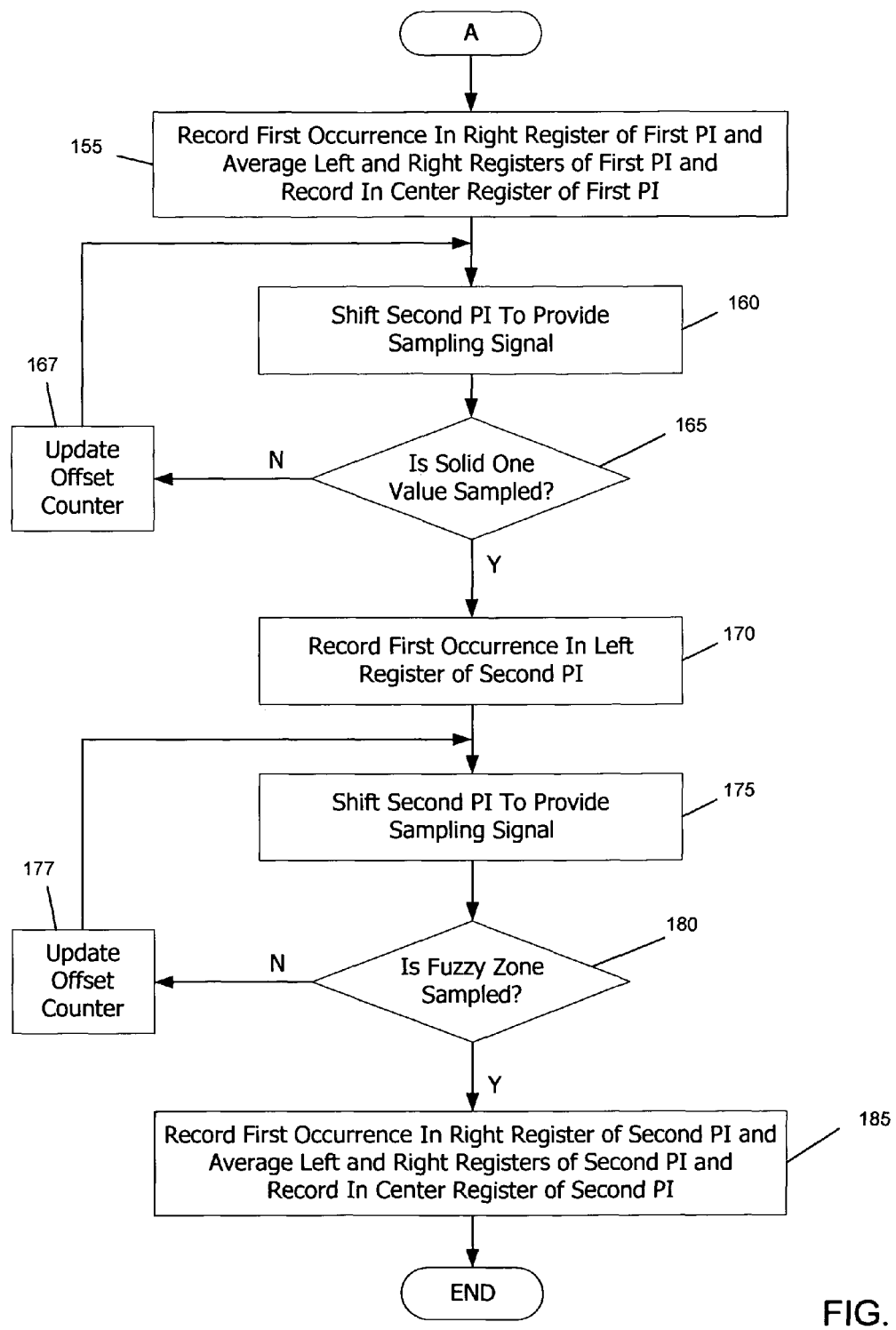

Referring now to FIGS. 3A and 3B, shown is a flow diagram for performing track pre-tuning in accordance with an embodiment of the present invention. As shown in FIG. 3A, method 100 begins by resetting all PI registers to correspond to a predetermined DLL position (block 110). For example, all PI registers may be set to a zero value, which corresponds to a zero degree phase of the DLL clock, i.e., a first DLL clock. Then, the PIs may be shifted in common to provide sampling signals (block 115). That is, both PIs may shift together one step (i.e., one offset counter value) at a time and provide a sampling signal to the samplers until a solid one is sampled, as determined at diamond 120. If such a value is not sampled, the offset counter is updated (block 122) and control passes back to block 115.

When the solid one value is sampled, this provides a baseline, ensuring that the tuning is consistent and that the left edge of the even eye is first seen. Thus at block 130 the PIs may be shifted in common again to provide sampling signals. Then it may be determined on each shift whether a solid zero value is sampled (diamond 135). If not, the offset counter is updated in block 137 and the PIs continue to be commonly shifted. When the solid zero value is sampled, control passes to block 140, where the first occurrence of this value may be recorded in all PI registers. Then a fuzzy zone, which corresponds to a finding of multiple one or zero values that do not meet a threshold number for a solid indication, is searched for at diamond 150, with further common shifting of the PIs (block 145). The offset counter is continuously updated at block 152 until this fuzzy zone is sampled.

Now referring to FIG. 3B, control passes to block 155, where the first occurrence of this fuzzy zone may be recorded in the right register of the first phase interpolator (i.e., the 90 degree phase interpolator). Still further, the average of the left and right registers may be recorded in the center register of the first phase interpolator. Thus at this point, the pre-tuning of the first phase interpolator is completed and the center register should contain an offset value which is guaranteed to place the sampling signal of the first phase interpolator in the data eye of the even eye.

Still referring to FIG. 3B, at block 160 the second phase interpolator may be shifted to provide a sampling signal which may continue until a solid one value is sampled at diamond 165. If not, the offset counter is updated at block 167. When the solid one value is sampled, control passes to block 170, where the first occurrence of this solid one value is recorded in the left register of the second (i.e., 270 degree) phase interpolator. After this, the second phase interpolator continues to be shifted to provide a sampling signal (block 175) until a fuzzy zone is sampled (diamond 180). Until that time, the offset counter continues to be updated (block 187). When the fuzzy zone is sampled, the first occurrence may be recorded in the right register of the second phase interpolator and the left and right registers of the second phase interpolator may be averaged to generate the center register value which is recorded in the center register (block 185). While shown with this particular implementation in the embodiment of FIGS. 3A and 3B, the scope of the present invention is not limited in this regard.

Table 1 below shows a summary of the process in accordance with one embodiment of the present invention.

TABLE 1

| Substage | 90-L | 90-C | 90-R | 270-L | 270-C | 270-R | Comments |
|---|---|---|---|---|---|---|---|
| Reset | 0 | 0 | 0 | 0 | 0 | 0 | |
| Baseline | X0 | X0 | X0 | X0 | X0 | X0 | Search for a solid 1 first |
| Find Solid 0 | X1 | X1 | X1 | X1 | X1 | X1 | X1 is where solid 0 starts |
| Find Next Fuzzy Zone | X1 | (X2 + X1)/2 | X2 | X2 | X2 | X2 | X2 is where solid 0 ends |
| Find Solid 1 | X1 | (X2 + X1)/2 | X2 | X3 | X3 | X3 | X3 is where solid 1 starts |
| Find Next Fuzzy Zone | X1 | (X2 + X1)/2 | X2 | X3 | (X3 + X4)/2 | X4 | X4 is where solid 1 ends |
| Done | X1 | (X2 + X1)/2 | X2 | X3 | (X3 + X4)/2 | X4 | |

Note that to find a solid '0 or '1, the data is repetitively sampled N times and a threshold is applied. For example, if 6 samples out of 8 are determined to be logic 1, the sampler output is recorded as 1. If 6 out of 8 are determined to be logic 0, the sampler output is recorded as 0. If neither threshold is met, the sample output is recorded as "X" or fuzzy.

At the end of track pre-tuning, the edges generated by the PIs are ideally expected to point to the center of the even and odd data eyes (e.g., as shown in FIG. 1). However, jitter on the data, common-mode noise introduced by the transmitter and channel as well as duty cycle problems may skew the center of the eyes from the PI sampling edge locations. The following two stages may determine boundaries of the eye opening and place the PI edges at the center of them.

In a left-eye-tune stage, the PI90 is shifted to the left until the even eye value is no longer captured correctly. This final PI90 location may be recorded in the PI left register. In the meantime, the PI90 center register is also adjusted to ensure that it always has the average value of left and right registers. The PI270 registers may be tuned simultaneously in the same manner. Then a right-eye-tune stage may occur. In this stage, the PI90 and PI270 are shifted to the right until the even and odd eye values are no longer captured correctly. The right registers and the center registers record the right eye boundaries and the eye centers just like in the left-eye-tune stage.

Accordingly, at high speed (e.g., 6.4 Gb/s) operation, when the effective eye width can be as small as approximately 50% of unit interval (UI) (approximately 35 ps), it is guaranteed that after the track pre-tune state, the PI90 & PI270 generate sampling edges that are placed inside the eye openings, even with a large duty cycle variation. By only using 2 PIs, loading at the output of a DLL can be reduced, thus lowering the jitter. Power consumption may also be reduced. Further, embodiments detect the center of the data eyes independent of jitter and data duty cycles.

Figure 4:
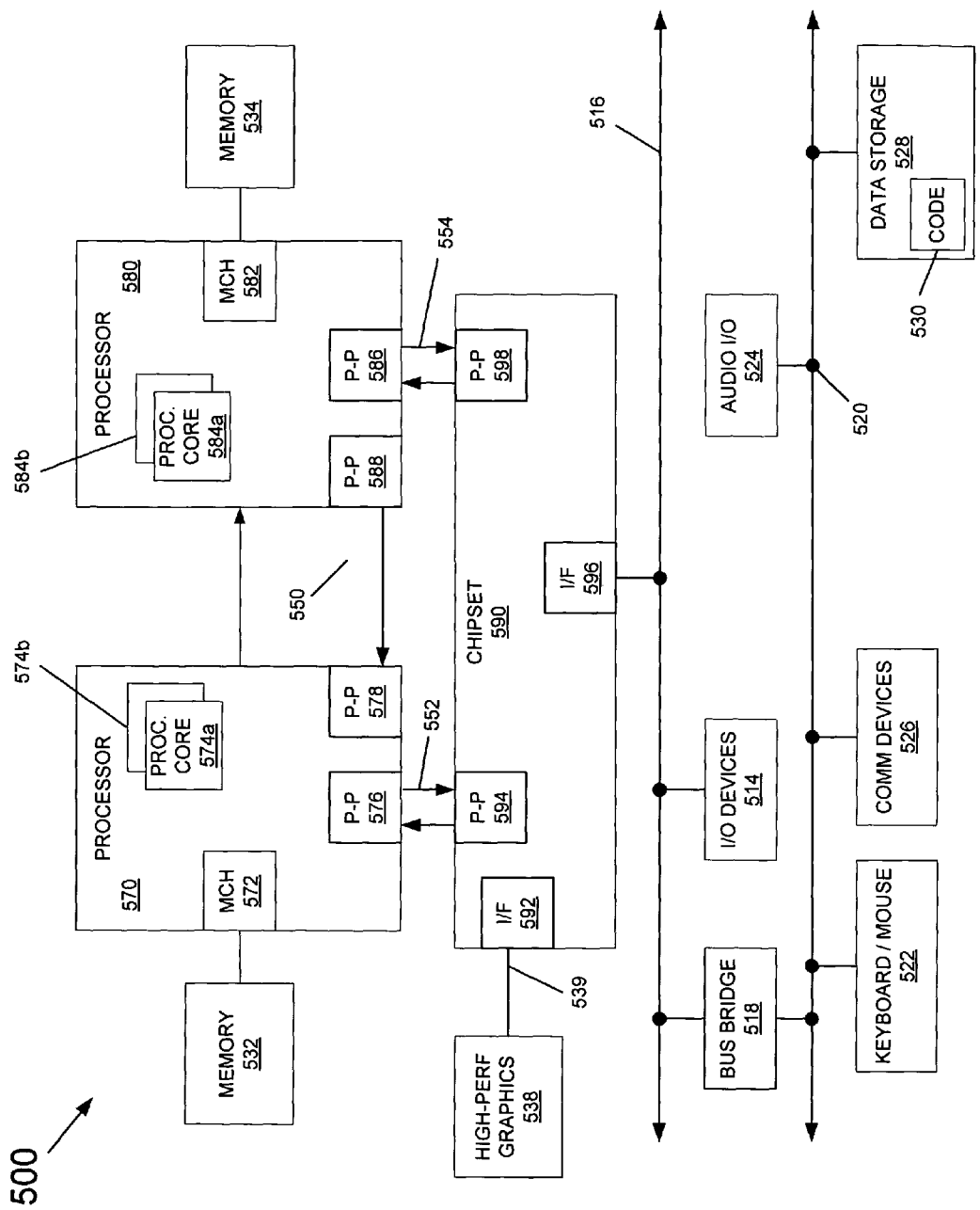
FIG. 4 is a block diagram of a system in accordance with an embodiment of the present invention.

Embodiments may be implemented in many different system types. Referring now to FIG. 4, shown is a block diagram of a system in accordance with an embodiment of the present invention. As shown in FIG. 4, multiprocessor system 500 is a point-to-point interconnect system, and includes a first processor 570 and a second processor 580 coupled via a point-to-point interconnect 550. As shown in FIG. 4, each of processors 570 and 580 may be multicore processors, including first and second processor cores (i.e., processor cores 574a and 574b and processor cores 584a and 584b).

Still referring to FIG. 4, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 4, MCH's 572 and 582 couple the processors to respective memories, namely a memory 532 and a memory 534, which may be portions of main memory (e.g., a dynamic random access memory (DRAM)) locally attached to the respective processors. First processor 570 and second processor 580 may be coupled to a chipset 590 via P-P interconnects 552 and 554, respectively. As shown in FIG. 4, chipset 590 includes P-P interfaces 594 and 598. Various components within system 500 may include hardware, software, firmware or combinations thereof to perform track pre-tuning in accordance with an embodiment of the present invention.

Furthermore, chipset 590 includes an interface 592 to couple chipset 590 with a high performance graphics engine 538 via a P-P interconnect 539. In turn, chipset 590 may be coupled to a first bus 516 via an interface 596. As shown in FIG. 4, various I/O devices 514 may be coupled to first bus 516, along with a bus bridge 518 which couples first bus 516 to a second bus 520. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
resetting a first register set of a first phase interpolator (PI) of a receiver and resetting a second register set of a second PI of the receiver to correspond to a predetermined delay lock loop (DLL) clock position;
shifting the first and second PIs in common beginning from the predetermined DLL clock position to provide sampling signals until a predetermined logic value of an input signal received by the receiver is sampled in a first sampler and a second sampler, the predetermined value indicative of a baseline position of a track pre-tuning operation; and
shifting the first and second PIs in common to provide sampling signals until a solid logic value having an opposite value from the predetermined value is sampled in the first and second samplers, and recording an offset value corresponding to a first occurrence of said solid logic value in the first register set and the second register set.

2. The method of claim 1, further comprising shifting the first and second phase interpolators in common beginning from the recorded offset value for the first and second PIs to provide sampling signals until a first fuzzy zone is sampled in the first and second samplers.

3. The method of claim 2, further comprising recording a first occurrence of the first fuzzy zone in a first register of the first PI and generating a center value for a second register of the first PI using the recorded offset value stored in a third register of the first PI and the recorded first occurrence of the first fuzzy zone stored in the first register of the first PI.

4. The method of claim 3, further comprising shifting the second PI to provide sampling signals until a solid logic value of the predetermined value is sampled in the second sampler, and recording a first occurrence of the solid logic value of the predetermined value in a third register of the second PI.

5. The method of claim 4, further comprising shifting the second PI to provide sampling signals until a second fuzzy zone is sampled in the second sampler, and recording a first occurrence of the second fuzzy zone in a first register of the second PI.

6. The method of claim 5, further comprising generating a center value for a second register of the second PI using the first register value of the second PI and the third register value of the second PI.

7. The method of claim 6, further comprising performing left eye tuning using the values stored in the first register of the first and second PIs.

8. The method of claim 7, further comprising performing right eye tuning using the values stored in the third register of the first and second PIs.

9. The method of claim 1, wherein each data lane of a physical layer of the receiver includes no phase interpolators other than the first and second PIs.

10. The method of claim 1, further comprising receiving the offset value from a counter that counts a plurality of segments of the DLL clock.

11. The method of claim 1, further comprising mixing, in the first PI, a plurality of DLL clock phases based on a value stored in a first register of the first register set.

12. An apparatus comprising:
a receiver to receive data and a forwarded clock from a transmitter coupled to the receiver via a point-to-point (PtP) interconnect, the receiver including a delay lock loop (DLL) to receive the forwarded clock and to generate a plurality of clock phases therefrom, and an offset controller including a first register set for a first phase interpolator and a second register set for a second phase interpolator, wherein a value of the first register set and the second register set corresponds to a predetermined one of the plurality of clock phases at initiation of a track pre-tune process so that the first and second phase interpolators shift in common from the predetermined clock phase at the track pre-tune process initiation, and the first phase interpolator is to generate sampling edges from the plurality of clock phases by mixing of at least two of the clock phases based on a value received from the first register set.

13. The apparatus of claim 12, wherein the second phase interpolator is to generate sampling edges from the plurality of clock phases by mixing of at least two of the clock phases based on a value received from the second register set.

14. The apparatus of claim 12, wherein the track pre-tune process is to shift the first and second phase interpolators in common to generate the sampling edges until a predetermined logic value of an input signal received by the receiver is sampled, the predetermined value indicative of a baseline position of the track pre-tune process, and thereafter shift the first and second phase interpolators in common to provide sampling edges until a solid logic value having an opposite value from the predetermined value is sampled, and record an offset value corresponding to a first occurrence of said solid logic value in the first register set and the second register set.

15. The apparatus of claim 14, wherein the track pre-tune process is to further shift the first and second phase interpolators in common beginning from the recorded offset value to provide the sampling edges until a first fuzzy zone is sampled.

16. The apparatus of claim 15, wherein the track pre-tune process is to further record a first occurrence of the first fuzzy zone in a first register of the first register set and generate a center value for a second register of the first register set using the recorded offset value stored in a third register of the first register set and the recorded first occurrence of the first fuzzy zone stored in the first register of the first register set.

* * * * *